US011169593B2

(12) United States Patent
Srinivas et al.

(10) Patent No.: US 11,169,593 B2
(45) Date of Patent: *Nov. 9, 2021

(54) SELECTIVE COUPLING OF MEMORY TO VOLTAGE RAILS FOR DIFFERENT OPERATING MODES

(71) Applicant: QUALCOMM Incorporated, San Diego, CA (US)

(72) Inventors: Raghavendra Srinivas, Blacksburg, VA (US); Bharat Kumar Rangarajan, Bangalore (IN); Rajesh Arimilli, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/929,732

(22) Filed: May 19, 2020

(65) Prior Publication Data

US 2020/0278739 A1 Sep. 3, 2020

Related U.S. Application Data

(63) Continuation of application No. 15/908,534, filed on Feb. 28, 2018, now Pat. No. 10,691,195.

(51) Int. Cl.
*G06F 1/00* (2006.01)
*G06F 1/3296* (2019.01)
(Continued)

(52) U.S. Cl.
CPC ............ *G06F 1/3296* (2013.01); *G06F 1/263* (2013.01); *G06F 1/324* (2013.01); *G06F 1/3206* (2013.01);
(Continued)

(58) Field of Classification Search
CPC ...... G06F 1/263; G06F 1/2306; G06F 1/3225; G06F 1/324; G06F 1/3275; G06F 1/3296; G11C 5/14; Y02D 10/00; Y02D 30/50
See application file for complete search history.

(56) References Cited

U.S. PATENT DOCUMENTS 6,026,014 A 2/2000 Sato et al.
7,542,369 B2 6/2009 Kenkare et al.
(Continued)

FOREIGN PATENT DOCUMENTS

WO 2017209835 A1 12/2017

OTHER PUBLICATIONS

International Search Report and Written Opinion—PCT/US2019/017894—ISA/EPO—dated May 9, 2019.

*Primary Examiner* — Nitin C Patel
(74) *Attorney, Agent, or Firm* — Qualcomm Incorporated

(57) ABSTRACT

Various aspects are described herein. In some aspects, the disclosure provides selective coupling of portions of a memory structure to voltage supplies. Certain aspects provide a computing device. The computing device includes a memory comprising a plurality of portions that are individually power collapsible. The computing device further includes a first voltage rail supplying a first voltage. The computing device further includes a second voltage rail supplying a second voltage. The computing device further includes a plurality of switching circuits, each switching circuit configured to selectively couple a corresponding one of the plurality of portions with the first voltage rail or the second voltage rail. The computing device further includes a controller configured to control each of the plurality of switching circuits based on a current active mode of the memory, and a current operating mode of each of the plurality of portions.

19 Claims, 4 Drawing Sheets

(51) Int. Cl.
  *G06F 1/3225* (2019.01)
  *G06F 1/3234* (2019.01)
  *G06F 1/324* (2019.01)
  *G11C 5/14* (2006.01)
  *G06F 1/3206* (2019.01)
  *G06F 1/26* (2006.01)

(52) U.S. Cl.
  CPC .......... *G06F 1/3225* (2013.01); *G06F 1/3275* (2013.01); *G11C 5/14* (2013.01)

(56) References Cited

U.S. PATENT DOCUMENTS

| | | |
|---|---|---|
| 9,529,533 B1 | 12/2016 | Dreesen et al. |
| 9,665,160 B1 | 5/2017 | Cao et al. |
| 2010/0128535 A1 | 5/2010 | Takahashi |
| 2010/0138684 A1 | 6/2010 | Kim et al. |
| 2012/0013319 A1 | 1/2012 | Patil et al. |
| 2013/0257500 A1 | 10/2013 | Lemkin |
| 2014/0232188 A1 | 8/2014 | Cheriyan et al. |
| 2016/0048199 A1* | 2/2016 | Kuroda ................. G06F 1/3287 713/323 |
| 2016/0070582 A1 | 3/2016 | Clovis et al. |
| 2016/0308372 A1 | 10/2016 | Kolla |
| 2017/0033796 A1 | 2/2017 | Cao et al. |
| 2017/0220094 A1 | 8/2017 | Ozawa |
| 2019/0088335 A1 | 3/2019 | Hsiung et al. |
| 2019/0265778 A1 | 8/2019 | Srinivas et al. |

* cited by examiner

SELECTIVE COUPLING OF MEMORY TO VOLTAGE RAILS FOR DIFFERENT OPERATING MODES

CLAIM OF PRIORITY

The present Application for Patent is a continuation application of and claims priority to application Ser. No. 15/908,534 entitled "SELECTIVE COUPLING OF MEMORY TO VOLTAGE RAILS BASED ON OPERATING MODE OF PROCESSOR" filed Feb. 28, 2018, now U.S. Pat. No. 10,691,195, issued Jun. 23, 2020, and assigned to the assignee hereof and hereby expressly incorporated by reference herein.

TECHNICAL FIELD

The teachings of the present disclosure relate generally to power management for volatile memory, and in certain aspects, to selective coupling of portions of a memory structure to voltage supplies.

INTRODUCTION

Computing devices, such as a computing device implementing a system-on-chip (SoC) architecture, may include multiple subsystems. For example, a SoC generally includes one or more central processing unit (CPU) subsystems (CPUSS), graphics processing unit (GPU) subsystems (GPUSS), digital signal processor (DSP) subsystems (DSPSS), etc. Each subsystem may include multiple computing cores and volatile memory (e.g., registers, cache, such as L1, L2, L3 cache, etc.) associated with the multiple computing cores. For example, a CPUSS may include multiple CPU cores embedded in an integrated circuit or chip and coupled to a local bus. The CPU cores may further be arranged into one or more computing clusters.

In certain cases, the computing cores of separate subsystems are powered by separate voltage rails, meaning that the cores of different subsystems can operate at different voltages. The voltage supplied to a computing core on its voltage rail associated with its subsystem is referred to as VDD_APC (e.g., voltage for the application processor core). Further, volatile memory across the computing device may be powered by a common voltage rail, meaning the volatile memory in each subsystem operates at the same voltage. The voltage supplied to the memory on its voltage rail is referred to as VDD_MX (e.g., voltage for the memory).

A subsystem (e.g., computing cores of the subsystem) may be configured to run in different active operating modes where the computing cores of the subsystem run at different frequencies. For example, the subsystem may run in a nominal mode where the computing cores run at a first frequency, and may run in a turbo mode where the computing cores runs at a second frequency that is higher than the first frequency. Accordingly, the memory in the subsystem may also need to be able to handle memory transactions at the first frequency when the subsystem is in the nominal mode, and at the second frequency when the subsystem is in the turbo mode. The memory may require a higher voltage to run at the second frequency than at the first frequency.

For example, if all the subsystems of the computing device are operating in a nominal mode, the memory may need a first voltage level to operate. Accordingly, VDD_MX may be set to the first voltage. However, if a first subsystem of the computing device is then operated in a turbo mode, the memory associated with the first subsystem needs a second voltage level to operate that is higher than the first voltage level. One method to power the memory of the first subsystem with the second voltage level is to increase VDD_MX to the second voltage. However, since all the memory associated with all the subsystems share VDD_MX, some memory associated with subsystems operating in nominal mode would then use the higher second voltage level to operate, even though it is not needed, which wastes power.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In some aspects, the present disclosure provides a computing device. The computing device includes a memory comprising a plurality of portions that are individually power collapsible. The computing device further includes a first voltage rail supplying a first voltage. The computing device further includes a second voltage rail supplying a second voltage. The computing device further includes a plurality of switching circuits, each switching circuit configured to selectively couple a corresponding one of the plurality of portions with the first voltage rail or the second voltage rail. The computing device further includes a controller configured to control each of the plurality of switching circuits based on a current active mode of the memory, and a current operating mode of each of the plurality of portions.

In some aspects, the present disclosure provides a method for selectively coupling portions of memory to different voltage rails. The method includes determining a current active mode of a memory. The method further includes determining a current operating mode of each of a plurality of portions of the memory that are individually power collapsible. The method further includes controlling each of a plurality switching circuits based on the current active mode of the memory, and the current operating mode of each of the plurality of portions, each switching circuit configured to selectively couple a corresponding one of the plurality of portions with a first voltage rail or a second voltage rail.

In some aspects, the present disclosure provides a computing device. The computing device includes means for storing data comprising a plurality of portions that are individually power collapsible. The computing device further includes means for supplying a first voltage. The computing device further includes means for supplying a second voltage. The computing device further includes a plurality of means for selectively coupling each of a corresponding one of the plurality of portions with the means for supplying the first voltage or the means for supplying the second voltage based on a current active mode of the means for storing data, and a current operating mode of each of the plurality of portions.

In some aspects, the present disclosure provides a non-transitory computer-readable medium having instructions stored thereon that when executed by circuitry cause the circuitry to perform a method for selectively coupling portions of memory to different voltage rails. The method includes determining a current active mode of a memory.

The method further includes determining a current operating mode of each of a plurality of portions of the memory that are individually power collapsible. The method further includes controlling each of a plurality switching circuits based on the current active mode of the memory, and the current operating mode of each of the plurality of portions, each switching circuit configured to selectively couple a corresponding one of the plurality of portions with a first voltage rail or a second voltage rail.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Although the teachings of this disclosure are illustrated in terms of integrated circuits (e.g., a SoC) as an example of computing devices, the teachings are applicable in other areas. The teachings disclosed should not be construed to be limited to SoC designs or the illustrated embodiments. The illustrated embodiments are merely vehicles to describe and illustrate examples of the inventive teachings disclosed herein.

Figure 1:
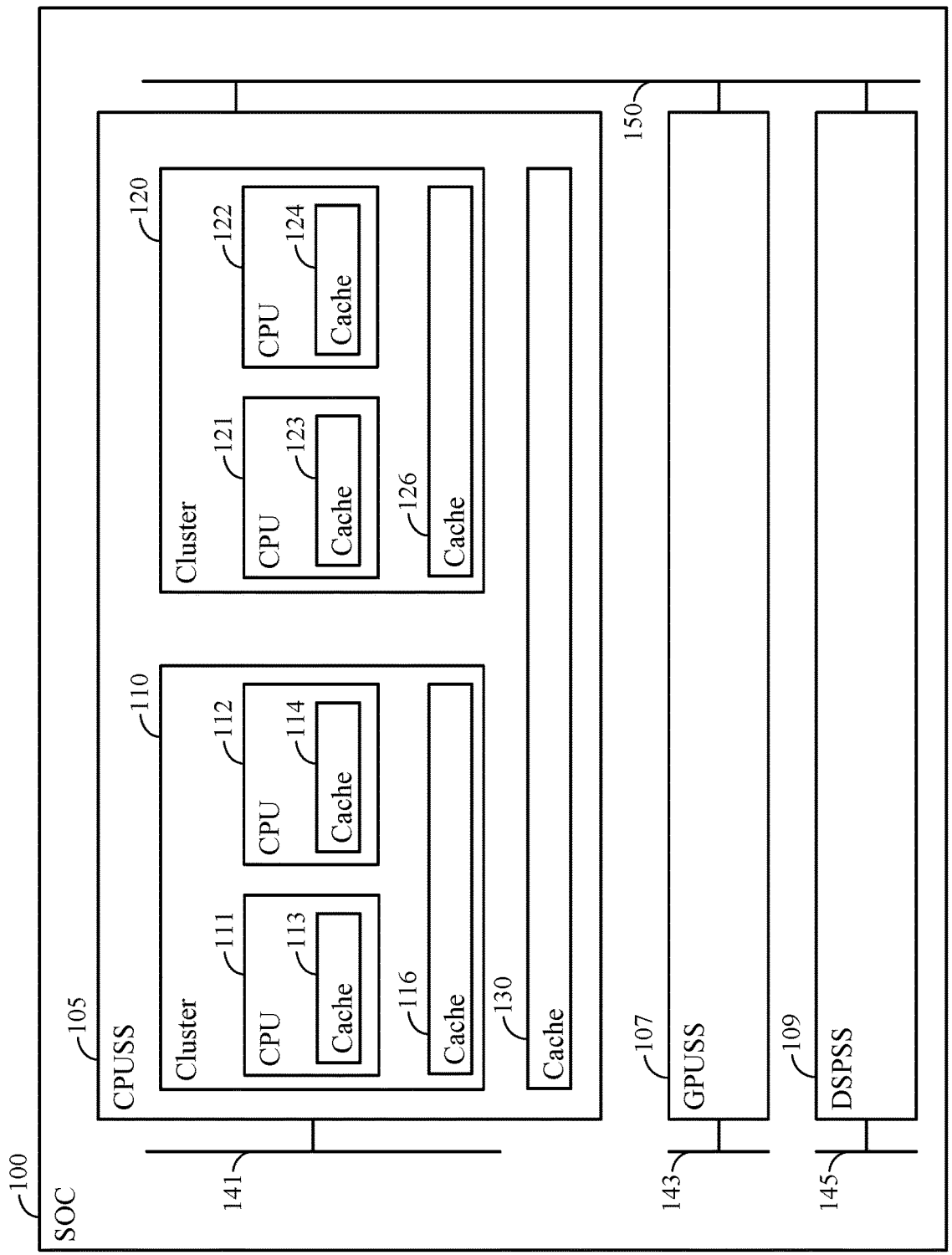
FIG. 1 is a simplified schematic diagram of a computing device, in accordance with certain aspects of the present disclosure.

FIG. 1 a simplified schematic diagram of an exemplary computing device 100, in accordance with certain aspects of the present disclosure. In particular, computing device 100 is shown as a SoC and is referred to as SoC 100 herein. The SoC 100 may include additional components or fewer components than shown, and further may be interconnected to other chips by one or more chip-to-chip interfaces such as peripheral component interconnect express (PCIe), universal serial bus (USB), serial peripheral interface (SPI), etc.

As shown, the SoC 100 includes a CPU sub-system (CPUSS) 105. The CPUSS 105 includes a plurality of CPU cores 111, 112, 121, and 122. Though CPUSS 105 is shown with a particular number of CPU cores, it should be noted that there may be additional or fewer cores in CPUSS 105. Further, CPU cores 111 and 112 are part of a cluster 110, and CPU cores 121 and 122 are part of a cluster 120. Again, though shown with a particular number of CPU clusters, CPUSS 105 may include additional or fewer clusters. Further, each cluster may include the same or a different number of CPU cores. The CPU cores 111, 112, 121, and 122 may be of the same type, or may be of different types (e.g., ARM design, non-ARM design, etc.). Further, the CPU cores of a given cluster (e.g., CPU cluster 110 or 120) may be of the same type, or may be of different types (e.g., in-cluster big.LITTLE design, cluster based big.LITTLE design, etc.). A big.LITTLE design may refer to a computing architecture that includes low power, slower processor cores (e.g., LITTLE) that provide battery-savings along with high power, faster processor cores (e.g., big) that provide better processing performance.

Further, the CPUSS 105 may include CPU resources, such as one or more volatile memories (e.g., caches) used by CPU cores for memory storage. For example, CPUSS 105 includes caches 113, 114, 116, 123, 124, 126, and 130. Caches 113, 114, 123, and 124 may be CPU core specific (e.g., L1 caches), meaning each of caches 113, 114, 123, and 124 is associated with and used by one of CPU cores 111, 112, 121, and 122. As shown, caches 113, 114, 123, and 124 are associated with CPU cores 111, 112, 121, and 122, respectively. Caches 116 and 126 may be CPU cluster specific (e.g., L2 caches), meaning each of caches 116 and 126 is associated with and used by each of the CPU cores of one of CPU clusters 110 and 120. As shown, caches 116 and 126 are associated with CPU clusters 110 and 120 respectively. Accordingly, cache 116 may be shared by CPU cores 111 and 112, and cache 126 may be shared by CPU cores 121 and 122. Cache 130 may be CPUSS specific (e.g., L3 cache), meaning cache 130 is shared by the CPU cores 111, 112, 121, and 122 of CPUSS 105. It should be noted that the CPUSS 105 may include additional or different CPU resources than those shown.

The SoC 100 further may include one or more additional CPUSS, one or more GPUSS such as GPUSS 107, and one or more DSPSS such as DSPSS 109. In certain aspects, each of GPUSS 107 and DSPSS 109 may have its own computing cores and volatile memory, similar to CPUSS 105. The internal components of the SoC 100 may be coupled together by a bus (not shown). It should be noted that though certain aspects are described with respect to a CPUS S and CPU cores as computing cores, techniques and aspects herein can also be used for other subsystem types (e.g., GPUSS, DSPSS, etc.) with other computing core types (e.g., GPU, DSP, etc.).

Each subsystem CPUSS 105, GPUSS 107, and DSPSS 109 of SoC 100 is supplied power by a separate voltage rail 141, 143, and 145, respectively In particular, voltage rails 141, 143, and 145 are configured to supply a voltage (referred to as VDD_APC) to CPUSS 105, GPUSS 107, and DSPSS 109, respectively, such as to power the computing cores of CPUSS 105, GPUSS 107, and DSPSS 109, respectively. The voltage rail 141 supplies a first voltage VDD_APC_1 to CPUSS 105, the voltage rail 143 supplies a second voltage VDD_APC_2 to GPUSS 107, and the voltage rail 145 supplies a third voltage VDD_APC_3 to DSPSS 109. Though not shown, in certain aspects, each cluster may be supplied power by a separate voltage rail.

Further, each subsystem CPUSS 105, GPUSS 107, and DSPSS 109 of SoC 100 is supplied power by a common voltage rail 150. In particular, voltage rail 150 is configured to supply a voltage (referred to as VDD_MX) to each of CPUSS 105, GPUSS 107, and DSPSS 109, such as to power the caches of each of CPUSS 105, GPUSS 107, and DSPSS 109.

As discussed, each subsystem CPUSS 105, GPUSS 107, and DSPSS 109 may be configured to run in different active operating modes (e.g., nominal mode, turbo mode, etc.) where the computing cores of the subsystem run at different frequencies. For example, the CPUSS 105 may run in a nominal mode where the CPU cores 111, 112, 121, and 122 run at a first frequency, and may run in a turbo mode where the CPU cores 111, 112, 121, and 122 run at a second frequency that is higher than the first frequency. Accordingly, the caches 113, 114, 116, 123, 124, 126, and 130 in the CPUSS 105 may also need to be able to handle memory transactions at the first frequency when the CPUSS 105 is in the nominal mode, and at the second frequency when the CPUSS 105 is in the turbo mode. The caches 113, 114, 116, 123, 124, 126, and 130 may require a higher voltage to run at the second frequency than at the first frequency.

Individual computing cores of each subsystem may also be capable of running in either an active mode or one or more low power modes, such as a power collapse mode, retention mode, etc. For example, each of CPU cores 111, 112, 121, and 122 may run in an active mode (e.g., turbo mode or nominal mode) corresponding to the active operating mode of CPUSS 105, a retention mode, or a power collapse mode. In the retention mode, a computing core may be clock gated and the volatile memory associated with the computing core may be retained so as to keep the current values stored in the volatile memory without changing the values. In the power collapse mode, the volatile memory may be flushed (e.g., to a non-volatile storage). In retention/power collapse modes, a computing core may be powered by a different rail supplying a lower voltage (e.g., a retention voltage lower than VDD_MX and VDD_APC) (not shown), or not be powered.

In certain aspects, SoC 100 includes switching circuitry (e.g., referred to as an array power mux (APM)) that allows volatile memory, such as caches 113, 114, 116, 123, 124, 126, and 130 to selectively either be coupled to a voltage rail supplying VDD_APC, such as voltage rail 141, or to a voltage rail supplying VDD_MX, such as voltage rail 150.

Figure 2:
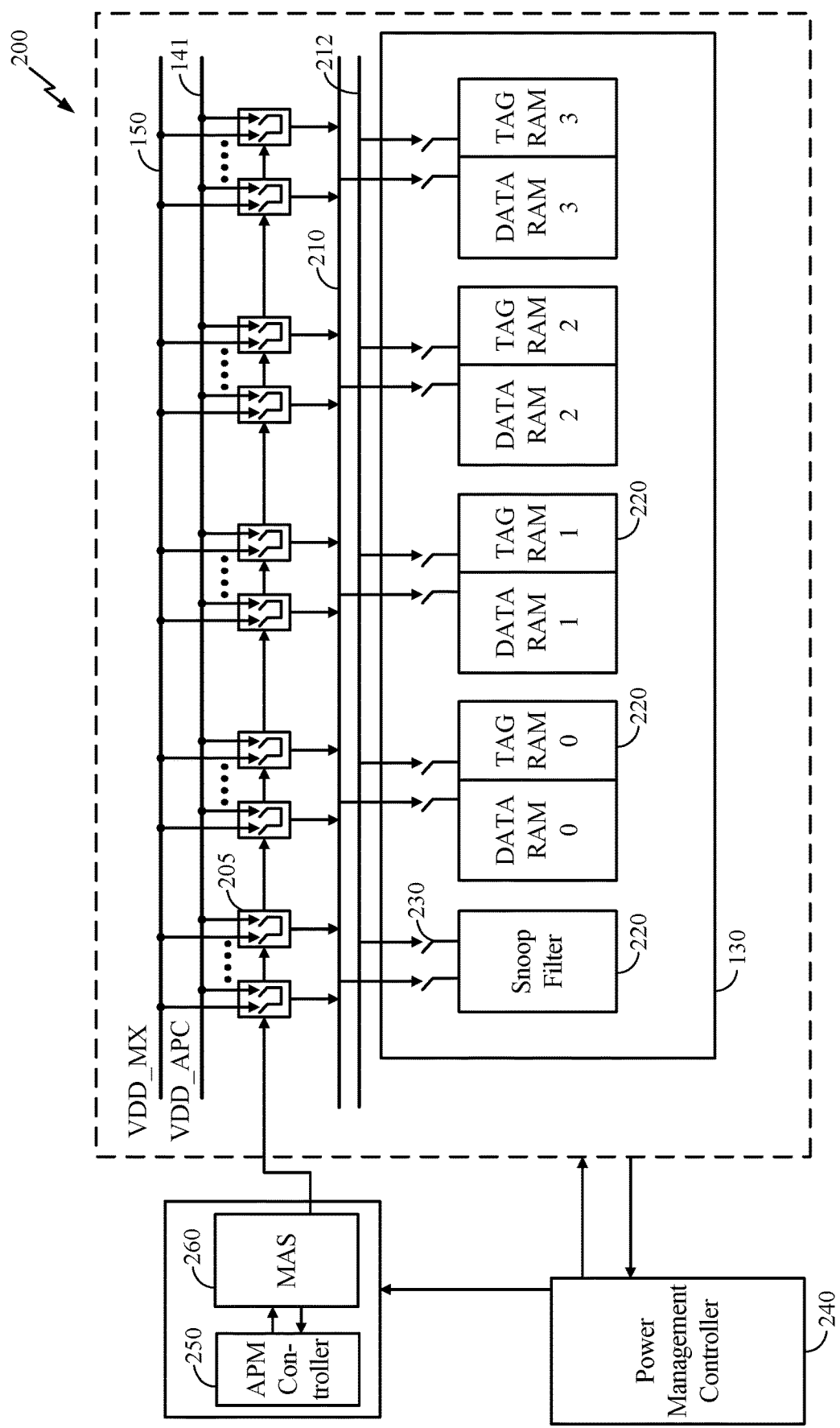
FIG. 2 is a simplified schematic diagram of switching circuitry that may be included in the computing device of FIG. 1, in accordance with certain aspects of the present disclosure.

FIG. 2 is a simplified schematic diagram of switching circuitry 200 that may be included in SoC 100, in accordance with certain aspects of the present disclosure. In particular, switching circuitry 200 is shown coupled to cache 130, described with respect to FIG. 1. It should be noted that though certain examples are described with respect to cache 130, the techniques discussed herein may be applied to other suitable types of memory.

Switching circuitry 200 includes several switches 205. A switch 205 may be referred to as an APM tile. Each switch 205 may be configured to selectively couple to each of voltage rail 141, supplying VDD_APC, and voltage rail 150, supplying VDD_MX. For example, switch 205 may include circuitry (e.g., transistors) to selectively couple to either voltage rail 141 or to voltage rail 150 at a time. Each switch 205 is further coupled to a power rail 210. Accordingly, switches 205 may be switched so as to couple either voltage rail 141 or to voltage rail 150 to power rail 210, at a time.

Cache 130 may be an example of an individually power collapsible memory and may further be divided into individually power collapsible portions 220 (e.g., memory instances, such as corresponding to individually addressable cache lines). For example, as shown, cache 130 is divided into different portions 220 shown as a snoop filter (individually shown as a portion 220) and data RAM with corresponding tag RAM (together shown as a portion 220) that stores tags for the associated data. In certain aspects, if a particular portion 220 is put into a lower power mode (e.g., a retention mode or power collapse mode), the data RAM and corresponding tag RAM may be put into the low power mode together.

Each portion 220 may be selectively coupled to one of power rail 210 (e.g., when in an active mode), no voltage source (e.g., when in a power collapse mode), or a retention voltage source (e.g., shown as a power rail 212 that carries a retention voltage) (e.g., when in a retention mode) via one or more switches 230. In certain aspects, there may be multiple switches 230 (not shown) between power rail 212 or power rail 210 and a single portion 220 controlled together that are associated with the single portion 220 to reduce resistance along the path across the switches 230 to the single portion 220, thereby increasing efficiency of power transfer. The retention voltage source may be configured to supply a lower voltage (e.g., referred to as a retention voltage) than VDD_APC or VDD_MX. Accordingly, in certain aspects, each portion 220 may be supplied a voltage from either power rail 210, no voltage, or a retention voltage. For example, for a portion 220, if a corresponding one or more switches 230 are coupled to no voltage source, then the portion 220 is supplied no voltage. Further, for a portion 220, if a corresponding one or more switches 230 are coupled to power rail 210, then the portion 220 is supplied VDD_APC or VDD_MX (based on the switching of switches 205). For a portion 220, if a corresponding one or more switches 230 are coupled to the retention voltage source, then the portion 220 is supplied the retention voltage.

Figure 3:
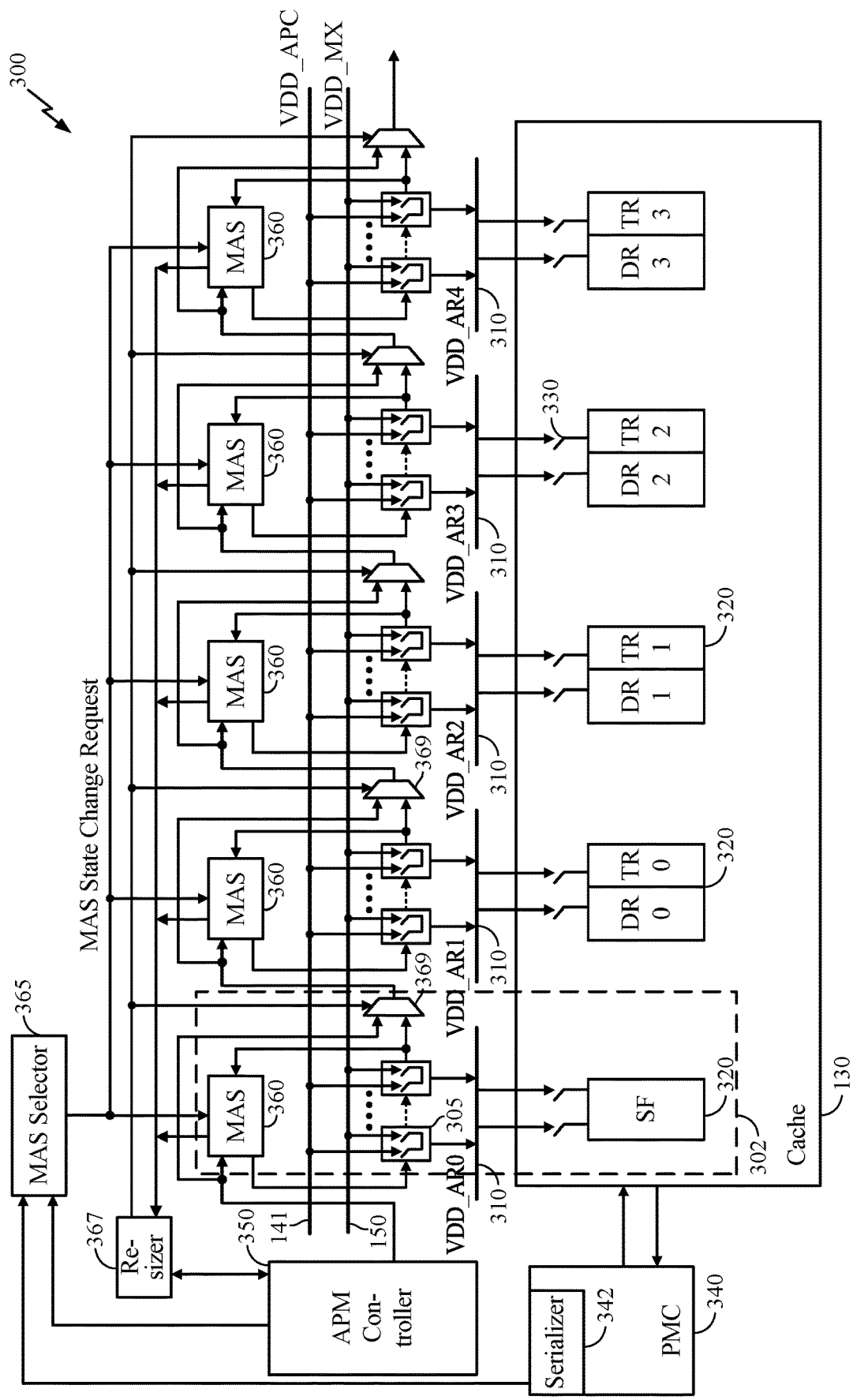
FIG. 3 is a simplified schematic diagram of switching circuitry that may be included in the computing device of FIG. 1, in accordance with certain aspects of the present disclosure.

In certain aspects, instead of each portion 220 being selectively couplable to the same power rail 210, each portion 220 may be selectively couplable to separate power rails (such as described with respect to FIG. 3 where each portion 320 is couplable to a separate power rail segment 310). In certain such aspects, the one or more switches 230 may be removed and each portion 220 may instead be directly coupled to the separate power rail. In such aspects, the voltage on each power rail may be controlled by corresponding switches 205 to put the portion 220 in one of the active mode, power collapse mode, or retention mode.

Switching circuitry 200 further includes a power management controller 240. Power management controller 240 is configured to control switches 230. For example, for each portion 220, power management controller 240 is configured to control corresponding switches 230 to selectively couple the portion 220 to one of power rail 210, no voltage source, or the retention voltage source to put the portion 220 in one of an active mode, power collapse mode, or retention mode, respectively. In certain aspects, power management controller 240 is configured to control switches 230 for each portion 220 based on a current operating mode (e.g., active mode, retention mode, or power collapse mode) of associated computing cores to also operate the portion 220 in the current operating mode.

For example, if a memory, such as cache 130, is associated only with a given computing core and that computing core is put in an active mode, each portion 220 of the memory may also be placed in the active mode. If a memory, such as cache 130, is associated only with a given computing core and that computing core is put in a low power mode (e.g., retention mode or power collapse mode), each portion 220 of the memory may also be placed in the low power mode.

If a memory is shared between computing cores, and one or more of the computing cores associated with the memory is put in a low power mode, a portion of the memory (e.g., a number of portions 220 proportional to the number of computing cores associated with the memory put into the low power mode) may correspondingly be put in the low power mode as well.

In certain aspects, each of the portions 220 corresponds to a tag or way of the cache 130. In certain aspects, the portions 220 are divided per computing core and allocated and dedicated to particular computing cores. Accordingly, the portions 220 may be controlled based on the mode of the corresponding computing core. In certain aspects, the number of portions 220 operated in a low power mode or an active mode is based on power and performance requirements (e.g., dynamic requirements) of the SoC 100.

Switching circuitry 200 further includes an APM controller 250 that in part controls the switching of switches 205. Switching circuitry 200 also includes a memory array sequencer (MAS) 260 that in part controls the switching of switches 205.

In particular, APM controller 250 and MAS 260 may be configured to selectively couple power rail 210 to voltage rail 141 or voltage rail 150 based on the active operating mode of CPUSS 105. For example, if CPUSS 105 is in nominal mode, APM controller 250 and MAS 260 are configured to switch switches 205 to couple power rail 210 to voltage rail 150. Further, if CPUSS 105 is in turbo mode, APM controller 250 and MAS 260 are configured to switch switches 205 to couple power rail 210 to voltage rail 141. In certain aspects, APM controller 250 may be configured to indicate to MAS 260 whether switches 205 should be switched to couple voltage rail 150 or to voltage rail 141. MAS 260 may be configured to serialize the switching of switches 205 to couple to the voltage rail 150 or voltage rail 141 as indicated by APM controller 250.

As discussed, if a memory, such as cache 130, is associated only with a given computing core and that computing core is put in a low power mode (e.g., retention mode or power collapse mode), each portion 220 of the memory may also be placed in the low power mode (based on the operation of switches 230 by power management controller 240).

However, if a memory, such as cache 130, is associated with one or more computing cores in an active mode, at least one of the portions 220 of cache 130 is coupled to power rail 210 based on the operation of switches 230 by power management controller 240. Accordingly, APM controller 250 and MAS 260 are configured to perform switching of switches 205 if an active operating mode of CPUSS 105 changes (e.g., from turbo mode to nominal mode or vice versa) to ensure that any active portions 220 receive the appropriate voltage from power rail 210. Therefore, if subsystem CPUSS 105 transitions from one mode to another (e.g., nominal mode to turbo mode), there will be latency in the switch, based on the latency for switching the associated memory, such as cache 130, from being coupled to one voltage rail (e.g., voltage rail 150) to being coupled to another voltage rail (e.g., voltage rail 141). In particular, there is latency in switching switches 205 to change the coupling of power rail 210 from the one voltage rail to the other, thereby causing a delay in changing a mode of active operation of CPUSS 105.

As discussed, MAS 260 may be configured to serialize the switching of switches 205 (e.g., in any order) to couple to the voltage rail 150 or voltage rail 141 as indicated by APM controller 250, meaning the switches 205 are switched one at a time in series, such as to account for in-rush management including droop on the voltage rail. The arrows between switches 205 indicate a path for a control signal for performing the switching from MAS 260 to the switches 205, where each switch 205 passes the control signal to the next in the path in series as shown. In certain aspects, the number of switches 205 used for switching a memory, such as cache 130, of a subsystem may be based on the number of portions 220 of the memory. For example, the number of switches 205 may be selected to handle static plus dynamic IR drop on the voltage rail. In certain aspects, dynamic IR drop refers to the worst case IR drop when there are active transactions associated with all portions 220 on the same clock edge. Therefore, the larger the memory, the larger the latency. In addition, the power consumption due to leakage and toggling power for the switches 205 is also proportional to the number of switches 205. Dots are shown between switches 205 to indicate that there may be a different number of switches 205 than illustrated. Further, switches 205 are shown as separate groups corresponding to separate portions 220 for ease of illustration only and should not be inferred as limiting the switches 205 of one group to be used to supply power to only a particular portion 220.

Based on the design of switching circuitry 200, all the memory in a subsystem associated with at least one computing core in an active mode is either coupled to VDD_MX or VDD_APC by the switching of all of the switches 205 based on the active operation mode (e.g., nominal mode or turbo mode) of the subsystem. That means that regardless of the state of individual portions 220 of the memory (e.g., active mode (e.g., turbo or nominal), or a low power mode) based on the state of corresponding computing core(s), all switches 205 associated with the memory are switched based on the active operation mode of the subsystem. This leads to excess latency and power consumption as discussed, as switches 205 used for portions 220 of memory in a low power mode are also switched.

Accordingly, certain aspects herein relate to systems and methods for selectively coupling portions of a memory structure to a first voltage rail or a second voltage rail based on whether the portion is in a lower power mode or an active mode.

FIG. 3 is a simplified schematic diagram of switching circuitry 300 that may be included in SoC 100, in accordance with certain aspects of the present disclosure. In particular, switching circuitry 300 is shown coupled to cache 130, described with respect to FIG. 1. It should be noted that though certain examples are described with respect to cache 130, the techniques discussed herein may be applied to other suitable types of memory.

Switching circuitry 300 may be similar to switching circuitry 200, as discussed with respect to FIG. 2, and include some components that are the same as switching circuitry 200. In particular, switching circuitry 300 includes multiple switches 305, which may be the same as switches 205 and selectively couple to either voltage rail 141 or voltage rail 150 at a time. However, instead of each of switches 305 further being coupled to the same power rail, different switches 305 (e.g., sets of switches 305) are coupled to different power rails 310, which may be referred to as power rail segments 310.

Further, cache 130 is divided into different individually collapsible portions 320 (e.g., the same as portions 220 described with respect to FIG. 2). Each portion 320 (or set of portions 320) may be associated with a separate power rail segment 310. Further, each power rail segment 310 may be associated with and coupled to one or more switches 305. The number of switches 305 associated with a power rail segment 310 may correspond to the size of the portion 320 associated with the power rail segment 310.

Switching circuitry 300 further includes one or more switches 330, which may be similar to switches 230, that selectively couple each portion 320 to one of its associated power rail segment 310 (e.g., when in an active mode), no voltage source (e.g., when in a power collapse mode), and/or a retention voltage source (not shown) (e.g., when in a retention mode).

Switching circuitry 300 further includes a power management controller 340, similar to power management controller 240. Power management controller 340 is configured to control switches 330. For example, for each portion 320, power management controller 340 is configured to control corresponding switches 330 to selectively couple the portion 320 to one of its associated power rail segment 310, no voltage source, or the retention voltage source to put the portion 320 in one of an active mode, power collapse mode, or retention mode, respectively. In certain aspects, power management controller 340 is configured to control switches 330 for each portion 320 based on an operation mode (e.g., active mode, retention mode, or power collapse mode) of associated computing cores, as discussed with respect to FIG. 2. The power management controller 340 further includes a serializer 342 that serializes the switching of switches 330 for different portions 320 if multiple portions 320 are to switch modes of operation at a time.

In certain aspects, the one or more switches 330 may be removed and each portion 320 may instead be directly coupled to the associated power rail segment 310, and the voltage on the power rail segment 310 may be controlled by corresponding switches 305 to put the portion 320 in one of the active mode, power collapse mode, or retention mode, such as discussed below with respect to switches 305 providing a retention voltage. In such aspects, the power management controller 340 may be configured to communicate with a corresponding MAS 360 to control the switches 305, there being a separate MAS 360 associated with each portion 320. As explained with respect to MAS 260, a MAS 360 is configured to serialize the switching of switches 305, as further discussed below.

Switching circuitry 300 further includes an APM controller 350 and a plurality of MAS 360, one MAS 360 associated with each portion 320. In addition switching circuitry 300 includes a MAS selector 365, a re-sizer 367 (e.g., an APM tile daisy chain re-sizer), and a plurality of multiplexers 369, one multiplexer 369 associated with each MAS 360. The APM controller 350, plurality of MAS 360, MAS selector 365, re-sizer 367, and plurality of multiplexers 369 together may control the switching of switches 305. The power management controller 340 is also connected to the plurality of MAS 360 via MAS selector 365 to in part control the switching of switches 305, as further discussed below.

Unlike switching circuitry 200 where all switches 205 are switched the same based on the active operation mode of the subsystem including cache 130, switching circuitry 300 is configured to selectively switch switches 305 based on both the active operating mode of the subsystem including cache 130 and a current operating mode of the portion 320 that the switches 305 are associated with.

For example, in certain aspects, if a particular portion 320 is in a low power mode (e.g., retention mode or power collapse mode), based on one or more associated computing cores being in a low power mode, and the subsystem changes from one operating mode (e.g., nominal) to another (e.g., turbo), then the switches 305 associated with the particular portion 320 are not switched. If a particular portion 320 is in an active mode based on one or more associated computing cores being in an active mode, and the subsystem changes from one operating mode (e.g., nominal) to another (e.g., turbo), then the switches 305 associated with the particular portion 320 are switched. Accordingly, even though the active operating mode of the subsystem has changed, the switches 305 of the portion 320 in a low power mode are not switched, since the portion 320 is not active, thereby saving on latency and power for switching.

In certain aspects, if a portion 320 that is in a low power mode is switched to an active mode, such as based on one or more associated computing cores being switched from a low power mode to an active mode, the corresponding switches 305 are switched, if needed, to couple the portion 320 to voltage rail 141 or voltage rail 150 based on the current active operating mode of the subsystem.

In certain aspects, power management controller 340 is coupled to MAS selector 365 and is configured to provide information to MAS selector 365 indicating which portions 320 are in a low power mode. The MAS selector 365 is further coupled to each MAS 360 and configured to set a state of each MAS 360 to either an active state or an inactive state. In particular, the MAS selector 365 is configured to set the state of a MAS 360 based on the operating mode (i.e., low power mode or active mode) of its associated portion 320. For a MAS 360 with an associated portion 320 in the low power mode, the MAS selector 365 is configured to set the MAS 360 to an inactive state by providing an indication to the MAS 360 to set its state to the inactive state. For a MAS 360 with an associated portion 320 in the active mode, the MAS selector 365 is configured to set the MAS 360 to an active state by providing an indication to the MAS 360 to set its state to the active state. In certain aspects, MAS selector 365 only provides an indication to a MAS 360 when it determines the MAS 360 should change from one state to another.

The APM controller 350 is further coupled to each MAS 360 (e.g., directly, via other MAS 360, and/or via multiplexers 369). The APM controller 350 is configured to send a trigger to the MAS 360 that are in the active state for switching the corresponding switches 305. In certain aspects, the switches 305 corresponding to each of the plurality of MAS 360 are controlled in series (e.g., in a sequential fashion from the snoop filter to data RAM3/tag RAM 3) based on the operation of the multiplexers 369. Accordingly, the switches 305 corresponding to one MAS 360 are first switched or not switched depending on the state of the MAS 360. After completion of the selective switching of switches 305 corresponding to one MAS 360, then the switches 305 corresponding to a next MAS 360 are selectively switched, and so on in series. In particular, the trigger may be passed from one MAS 360 to the next in series as discussed below.

In certain aspects, the APM controller 350 sends the trigger (e.g., a switching signal) to a first MAS 360 associated with the snoop filter portion 320 as well as a multiplexer 369 associated with first MAS 360. The first MAS 360, corresponding multiplexer 369, corresponding switches 305, corresponding portion 320, corresponding switches 330, and corresponding power rail segment 310 are shown bounded by box 302 for reference. The first MAS 360 is configured to pass or not pass (e.g., bypass, prevent switching, etc.) the switching signal to its corresponding switches 305 based on the state of the first MAS 360. If the first MAS 360 in the inactive state it is configured to not pass the switching signal to the switches 305 corresponding to the first MAS 360. If the first MAS 360 in the active state it is configured to send the switching signal to the switches 305 corresponding to the first MAS 360. Accordingly, the switches 305 corresponding to the first MAS 360 switch. The switching signal is then passed from the switches 305 corresponding to the first MAS 360 to the multiplexer 369 associated with the first MAS 360. A switching signal passed from the switches 305 corresponding to a MAS 360 to the multiplexer 369 associated with the MAS 360 may correspond to an ACKNOWLEDGMENT that the switching of the switches 305 is complete. The ACKNOWLEDGMENT may also be sent back to the first MAS 360 as feedback to the first MAS 360 that switching was completed successfully.

The multiplexer 369 corresponding to the first MAS 360 is configured to pass to the next MAS 360 and its corresponding multiplexer 369 either the switching signal directly received from the APM controller 350 or the switching signal received from the switches 305 corresponding to the first MAS 360. In particular, if the first MAS 360 is in the active state, then the corresponding multiplexer 369 is configured to pass to the next MAS 360 and its corresponding multiplexer 369 the switching signal received from the switches 305 corresponding to the first MAS 360. This ensures that the next MAS 360 only receives the switching signal and controls its corresponding switches 305 after the switches corresponding to the previous MAS 360 have switched, ensuring the switching of switches 305 corresponding to different MAS 360 is done in series. If the first MAS 360 is in the inactive state, then the corresponding multiplexer 369 is configured to pass to the next MAS 360 and its corresponding multiplexer 369 the switching signal received directly from the APM 350 (or for subsequent MAS 360, received directly from the multiplexer 369 corresponding to the previous MAS 360). This allows the switches 305 corresponding to the next MAS 360 to be controlled by the next MAS 360 more quickly, without waiting for a signal from the switches 305 corresponding to the previous MAS 360. Control of the multiplexers 369 of which switching signal to pass is performed by the re-sizer 367 as further discussed below. Subsequent MAS 360 and corresponding multiplexers 369 are similarly configured to selectively switch corresponding switches 305 and pass the switching signal, and the process continues in series for each MAS 360. Any MAS 360 that receives the switching signal and is in the active state accordingly causes the switches 305 associated with the MAS 360 to switch and couple the corresponding power rail segment 310 of the corresponding portion 320 to either the voltage rail 141 or the voltage rail 150 based on the current active state of the CPUSS 105.

The APM controller 350 is further coupled to re-sizer 367 and configured to determine a current active operating mode of its subsystem, for example CPUSS 105. In certain aspects, the APM controller 350 controls the re-sizer 367 to control the multiplexers 369 to selectively pass one of the switching signals as discussed before sending the trigger to the first MAS 360. If APM controller 350 determines that a current active operating mode of CPUSS 105 has changed (e.g., from nominal mode to turbo mode, or vice versa), then the APM controller 350 sends a trigger indicating a change in the current active operating mode of CPUSS 105 to re-sizer 367.

Re-sizer 367 is further coupled to each MAS 360. When the re-sizer 367 receives the trigger indicating a change in the current active operating mode of CPUSS 105, the re-sizer 367 is configured check the current state of each MAS 360. Based on the current state of each MAS 360, the re-sizer 367 is configured to control each multiplexer 369. For example, as discussed, each portion 320 is associated with a MAS 360, and each MAS 360 is associated with a multiplexer 369, and one or more switches 305.

For example, again with respect to box 302, if the first MAS 360 corresponding to the snoop filter portion 320 is in an active state, meaning the snoop filter portion 320 is in an active mode, then the re-sizer 367 is configured to control the multiplexer 369 corresponding to the first MAS 360 to pass a switching signal received from the switches 305 corresponding to the first MAS 360 to the next MAS 360 and its corresponding multiplexer 369 as discussed. If the first MAS 360 corresponding to the snoop filter portion 320 is in an inactive state, meaning the snoop filter portion 320 is in a low power mode, then the re-sizer 367 is configured to control the multiplexer 369 corresponding to the first MAS 360 to pass the switching signal received directly from APM controller 350 (or for subsequent MAS 360, received directly from the multiplexer 369 corresponding to the previous MAS 360) to the next MAS 360 and its corresponding multiplexer 369 as discussed.

Accordingly, re-sizer 367, multiplexers 369, and MAS 360, as discussed, are configured to resize the number of switches 305 that are able to be triggered to switch based on a change in the current active operating mode of CPUSS 105. In particular, the greater the number of switches 305 that are not passed the switching signal, the smaller the size of the number of switches 305 able to be triggered to switch. For example, the size of the number of switches 305 able to be triggered to switch may range from the number of switches 305 associated with the snoop filter only to the number of switches 305 associated with all of the portions 320.

Once the re-sizer 367 has properly controlled each multiplexer 369, it communicates the completion of the re-sizing to APM controller 350 so the APM controller 350 can send the switching signal to the first MAS 360 as discussed.

More generally, each MAS 360 may be configured to receive information from APM controller 350 indicating the current active operating mode of CPUSS 105 and receive signals from MAS selector 365 requesting a state change of the MAS 360 as needed based on information from the power management controller 340. The MAS 360 may then control the switches 305 associated with the MAS 360 accordingly. In particular, if the state of the MAS 360 is active and a current active operating mode of CPUSS 105 of the changes, then the MAS 360 controls switches 305 based on the current active operating mode of CPUSS 105. If the state of MAS 360 is inactive, then the MAS 360 does not switch switches 305 based on the current active operating mode of CPUSS 105, but rather may keep the switches 305 in their current state.

In certain aspects, APM controller 350 is also coupled to MAS selector 365 and configured to provide information to MAS selector 365 indicating the current active operating mode of CPUSS 105. If MAS selector 365 receives information from power management controller 340 that a particular portion 320 that is in a low power mode has changed to an active mode, then the MAS selector 365 indicates to the MAS 360 associated with the portion 320 to enter an active state and further indicates the current active operating mode of CPUSS 105. The MAS 360 may then control the switches 305 associated with the portion 320 based on the current active operating mode of CPUSS 105 as discussed. Accordingly, the portion 320 is coupled to the appropriate voltage rail 141 or 150 when switching from a low power mode to an active mode based on the current active operating mode of CPUSS 105.

In certain aspects, if a particular portion 320 is in retention mode, then the corresponding MAS 360 may provide some or all of the voltage (e.g., 160 mV) for keeping the memory portion in retention from voltage rail 150 or voltage rail 141 by controlling the corresponding switches 305 to provide voltage to the portion 320 from voltage rail 150 or voltage rail 141 (e.g., corresponding to diode drop voltage across switches 305). For example, even when the switches 305 are "open", where the switches 305 are transistors, there may be a diode drop across the switches 305 corresponding to the retention voltage. This may reduce leakage power and lead to power savings. For example, the power rail segment 310 associated with the portion may be at least part of the retention voltage source.

Figure 4:
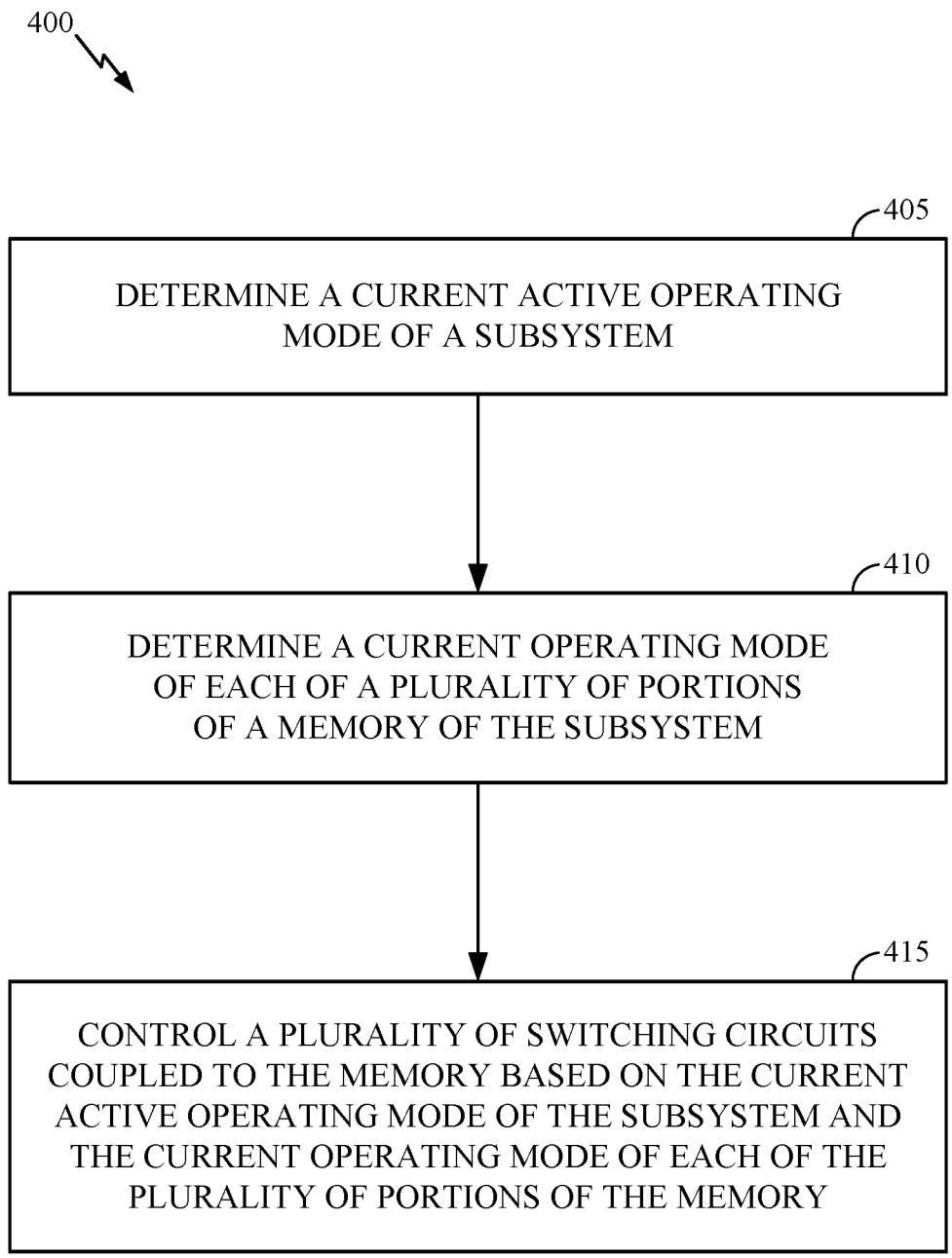
FIG. 4 is a flow chart that illustrates example operations for selectively coupling portions of memory to different voltage rails, in accordance with certain aspects of the present disclosure.

FIG. 4 is a flow chart that illustrates example operations for selectively coupling portions of memory to different voltage rails, in accordance with certain aspects of the present disclosure. For example, the operations of FIG. 4 may be performed by one or more controllers of the SoC 100 including switching circuitry 300, or another suitable circuit. Such controllers may comprise functionality or circuitry of power management controller 340, APM controller 350, plurality of MAS 360, MAS selector 365, re-sizer 367, and plurality of multiplexers 369.

At step 405, a controller associated with a subsystem determines a current active operating mode of the subsystem. For example, the controller may receive information from another controller to switch to a new active operating mode. The current active operating mode of the subsystem may also correspond to a current active mode (e.g., nominal mode or turbo mode) of a memory of the subsystem.

At step 410, the controller determines a current operating mode (e.g., active mode, power collapse mode, or retention mode) of each of a plurality of portions of the memory that are individually power collapsible. For example, the current operating mode of each of the plurality of portions of the memory may be based on a current operating mode of one or more computing cores associated with the memory.

At step 415, the controller controls a plurality switching circuits (e.g., each comprising one or more switches) based on the current active operating mode of the subsystem and the current operating mode of each of the plurality of portions of the memory. For example, in certain aspects, each switching circuit of the plurality of switching circuits is coupled to one of the plurality of portions of the memory, and further selectively coupled to one of a first voltage rail supplying a first voltage and a second voltage rail supplying a second voltage. The controller, accordingly, is configured to control each switching circuit, to selectively couple a corresponding portion of the memory to one of the first voltage rail and the second voltage rail based on the current active operating mode of the subsystem and the current operating mode of the portion of the memory.

In certain aspects, the controller is configured to cause a first switching circuit of the plurality of switching circuits to supply a retention voltage based on power from one of the first voltage rail or the second voltage rail to a first memory portion of the plurality of memory portions when the current operating mode of the first memory portion is a retention mode, wherein the retention voltage is less than the first voltage and the second voltage.

In certain aspects, the controller is configured to prevent a first switching circuit of the plurality of switching circuits coupled to a first memory portion from switching when the current operating mode of the first memory portion is a low power mode and the memory changes from a first active mode to a second active mode. In certain aspects, the controller is configured to cause the first switching circuit of the plurality of switching circuits coupled to the first memory portion to switch when the current operating mode of the first memory portion is an active mode and the memory changes from the first active mode to the second active mode.

In certain aspects, the controller is configured to cause a first switching circuit of the plurality of switching circuits coupled to a first memory portion to selectively couple the first memory portion to the first voltage rail or the second voltage rail based on the current active mode of the memory when the first memory portion changes from a low power mode to an active mode.

In some configurations, the term(s) 'communicate,' 'communicating,' and/or 'communication' may refer to 'receive,' 'receiving,' 'reception,' and/or other related or suitable aspects without necessarily deviating from the scope of the present disclosure. In some configurations, the term(s) 'communicate,' 'communicating,' 'communication,' may refer to 'transmit,' 'transmitting,' 'transmission,' and/or other related or suitable aspects without necessarily deviating from the scope of the present disclosure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

These apparatus and methods described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disc storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc. Combinations of the above should also be included within the scope of computer-readable media.

What is claimed is:

1. A memory, comprising:
    a plurality of portions that are individually power collapsible, wherein each of the plurality of portions is associated with a corresponding one of a plurality of computing cores;
    a first voltage rail supplying a first voltage;
    a second voltage rail supplying a second voltage;
    a plurality of switching circuits configured to selectively couple corresponding one of the plurality of portions to the first voltage rail or the second voltage rail; and
    a controller configured to control the plurality of switching circuits to supply each of the plurality of portions the first voltage, the second voltage, a retention voltage, or no voltage based on a mode of the associated one of the plurality of computing cores.

2. The memory of claim 1, wherein the retention voltage is generated from the first voltage rail or the second voltage rail and is less than the first voltage and the second voltage.

3. The memory of claim 2, wherein the retention voltage is a diode drop from the first voltage or the second voltage.

4. The memory of claim 1 further comprising a third voltage rail supplying the retention voltage, wherein the plurality of switching circuits configured to selectively couple corresponding one of the plurality of portions to the first voltage rail, the second voltage rail, or the third voltage rail.

5. The memory of claim 1, wherein the controller is configured to serially switch the plurality of switching circuits.

6. The memory of claim 1, wherein a number of portions of the plurality of portions in a low power mode is proportional to a number of computing cores in the low power mode.

7. The memory of claim 1, wherein each of the plurality of portion is supplied with the first voltage when the corresponding computing core is in a nominal mode, the second voltage when the corresponding computing core is in a turbo mode, the retention voltage or no voltage when the corresponding computing core is in a low power mode.

8. The memory of claim 1, wherein the memory is shared between the plurality of computing cores.

9. The memory of claim 1, wherein the memory is a cache.

10. The memory of claim 9, wherein each of the plurality of portions is one or more individually addressable cache lines.

11. The memory of claim 10, wherein each of the plurality of portions comprises a data RAM and a tag RAM and wherein the data RAM and the tag RAM are put into the same mode.

12. A computing device, comprising
a plurality of computing cores;
a memory comprising a plurality of portions that are individually power collapsible, wherein the memory is shared between the plurality of computing cores and wherein each of the plurality of portions is associated with one of the plurality of computing cores;
a plurality of switching circuits; and
a controller configured to control the plurality of switch circuits and selectively supply voltage to each of the plurality of portions based on a mode of the associated one of the plurality of computing cores.

13. The computing device of claim 12, wherein each of the plurality of portion is configured to couple to a power rail in an active mode, a no voltage source in a power collapse mode, or a retention voltage source in a retention mode through the plurality of switching circuits.

14. The computing device of claim 13, wherein a retention voltage of the retention voltage source is lower than a supply voltage of the power rail.

15. The computing device of claim 14, wherein the retention voltage source is generated from the power rail through the plurality of switching circuits.

16. The computing device of claim 12, wherein each of the plurality of switching circuits comprises multiple switches.

17. The computing device of claim 12, wherein each of the plurality of portions is an individually addressable cache line.

18. The computing device of claim 12, wherein the controller configured to control the plurality of switching circuits based on a current active mode of the plurality of computing cores and a current operating mode of each of the plurality of portions.

19. The computing device of claim 12, wherein the controller is configured to serially switch the plurality of switching circuits.

* * * * *